United States Patent
Doumae et al.

(10) Patent No.: US 9,583,422 B2
(45) Date of Patent: Feb. 28, 2017

(54) LEAD FRAME

(71) Applicants: SH MATERIALS CO., LTD., Tokyo (JP); NICHIA CORPORATION, Tokushima (JP)

(72) Inventors: Katsuyuki Doumae, Kagoshima (JP); Yoshio Ichihara, Tokushima (JP); Shimpei Sasaoka, Tokushima (JP)

(73) Assignees: SH MATERIALS CO., LTD., Tokyo (JP); NICHIA CORPORATION, Tokushima (JP)

( * ) Notice: Subject to any disclaimer, the term of this patent is extended or adjusted under 35 U.S.C. 154(b) by 0 days.

(21) Appl. No.: 15/002,640

(22) Filed: Jan. 21, 2016

(65) Prior Publication Data

US 2016/0218051 A1     Jul. 28, 2016

(30) Foreign Application Priority Data

Jan. 22, 2015   (JP) ................. 2015-010391

(51) Int. Cl.
*H01L 23/495*   (2006.01)

(52) U.S. Cl.
CPC .. *H01L 23/49544* (2013.01); *H01L 23/49503* (2013.01); *H01L 23/49541* (2013.01); *H01L 2924/0002* (2013.01)

(58) Field of Classification Search
CPC ............. H01L 23/49544; H01L 23/49503
USPC ................. 174/250, 255, 260, 261
See application file for complete search history.

(56) References Cited

U.S. PATENT DOCUMENTS

| | | | | |
|---|---|---|---|---|
| 6,888,231 B2* | 5/2005 | Maeda | ............... | H01L 23/3107 257/666 |
| 8,637,892 B2* | 1/2014 | Egoshi | ................. | H01L 24/97 257/676 |
| 9,379,273 B2* | 6/2016 | Yamamoto | ....... | H01L 31/02005 |
| 2008/0210964 A1* | 9/2008 | Tomioka | ............... | H01L 33/60 257/98 |
| 2010/0163920 A1* | 7/2010 | Itai | ...................... | H01L 33/486 257/99 |
| 2011/0186875 A1* | 8/2011 | Egoshi | .................. | H01L 24/97 257/89 |

(Continued)

FOREIGN PATENT DOCUMENTS

JP   2014-130973   7/2014

*Primary Examiner* — Hoa C Nguyen
*Assistant Examiner* — Amol Patel
(74) *Attorney, Agent, or Firm* — Wenderoth, Lind & Ponack, L.L.P.

(57) ABSTRACT

A lead frame, as one product unit in a multi-row lead frame sharing a partition frame among other lead frames, has a non-mirrorsymmetric pad region and at least one terminal region arranged inside and held to a rectangular outer frame region, which is a part of the partition frame and forms a boundary of the lead frame as a product unit, via respective suspension leads. Only two suspension leads hold the non-mirrorsymmetric pad region to the outer frame region as extending from opposite sides of the outer frame region to the non-mirrorsymmetric pad region, respectively. This structure decreases stress resulting from holding of the non-mirrorsymmetric pad region to the outer frame region and thus can prevent the outer frame region from deformation without widened connecting bars or dambars, which form the outer frame region.

5 Claims, 3 Drawing Sheets

(56) References Cited

U.S. PATENT DOCUMENTS

| | | | |
|---|---|---|---|
| 2012/0126266 A1* | 5/2012 | Watari | G02B 6/0031 257/98 |
| 2012/0132949 A1* | 5/2012 | Watari | H01L 33/54 257/99 |
| 2012/0273826 A1* | 11/2012 | Yamamoto | H01L 24/97 257/99 |
| 2014/0239321 A1* | 8/2014 | Lu | H01L 25/167 257/89 |

* cited by examiner

// LEAD FRAME

This application claims priority under 35 U.S.C. §119(a) to JP 2015-010391 filed on Jan. 22, 2015, the contents of which are hereby incorporated by reference.

BACKGROUND OF THE INVENTION

1) Field of the Invention

The present invention relates to a lead frame that forms a product unit in a multi-row lead frame formed by etching, having a non-mirrorsymmetric pad region.

2) Description of Related Art

As shown in FIG. 4, as a conventional example of this type of lead frame, there has been proposed in JP KOKAI No. 2014-130973 a lead frame structured to have a first region 51, which has a main body portion 51a and an extending portion 51b extending from the main body portion 51a with a decreased width, held via three or more suspension leads 53, 54, 55, 56 and 57 in three directions lengthwise and breadthwise from an outer frame region 52. In FIG. 4, the reference numeral 65 denotes a region that is to turn into a semiconductor package as a product unit, the reference numerals 58 and 63 denote another regions that are to turn into terminals in the frame, the reference numerals 59-62 denote suspension leads which support the region 58 in three directions lengthwise and breadthwise from the outer frame region 52, and the reference numeral 64 denotes a suspension lead which supports the region 52 in one direction from the outer frame region 52.

SUMMARY OF THE INVENTION

An object of the present invention is to provide a lead frame that makes it possible to prevent a frame of a multi-row lead frame, in which the lead frame forms a product unit upon sharing a partition frame among other product units, from deformation by diminishing, as much as possible, stress caused by hold of a non-mirrorsymmetric pad region without widening connection bars or dambars forming an outer frame region, which is a part of the partition frame and forms a boundary of the lead frame as a product unit.

In order to attain the above-mentioned object, a lead frame according to the present invention forms a product unit upon sharing a partition frame among other product units in a multi-row lead frame and has a non-mirrorsymmetric pad region and at least one terminal region arranged inside and held to a rectangular outer frame region, which is a part of the partition frame and forms a boundary of the lead frame as a product unit, via respective suspension leads, wherein suspension leads that hold the non-mirrorsymmetric pad region to the outer frame region is composed of two suspension leads, which extend from opposite sides of the rectangular outer frame region to the non-mirrorsymmetric pad region, respectively.

According to the lead frame of the present invention, it is preferred that the two suspension leads that hold the non-mirrorsymmetric pad region to the outer frame region extend in parallel directions.

According to the lead frame of the present invention, it is preferred that the two suspension leads that hold the non-mirrorsymmetric pad region are joined to the non-mirrorsymmetric pad region at positions that are equidistant from a center of gravity of the non-mirrorsymmetric pad region, respectively.

According to the present invention, there can be provided a lead frame that makes it possible to prevent a frame of a multi-row lead frame, in which the lead frame forms a product unit, from deformation by diminishing, as much as possible, stress caused by hold of a non-mirrorsymmetric pad region without widening connection bars or dambars forming an outer frame region.

These and other features and advantages of the present invention will become apparent from the following detailed description of the preferred embodiment when taken in conjunction with the accompanying drawings.

DETAILED DESCRIPTION OF THE PREFERRED EMBODIMENTS

Figure 1:
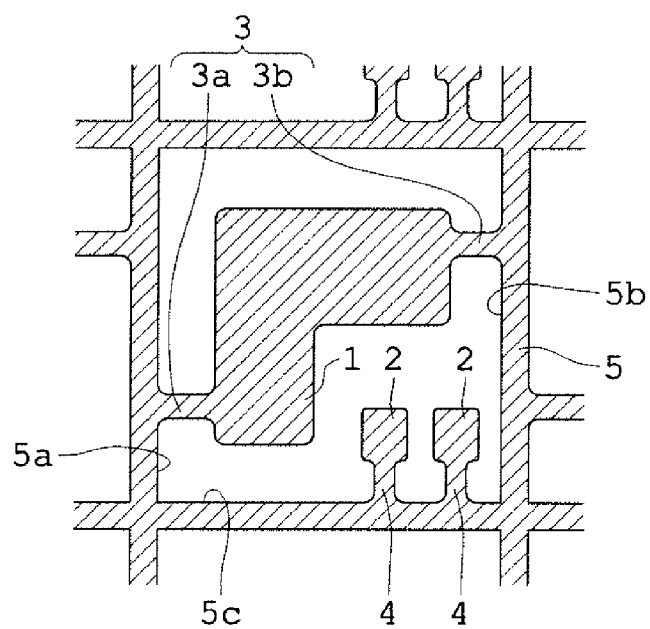
FIG. 1. is a diagram that schematically shows the configuration of the essential part of the lead frame according to the first embodiment mode of the present invention.

Preceding the explanation of the embodiment mode, the function and effect of the embodiment mode will be explained.

A lead frame according to the embodiment mode of the present invention forms a product unit upon sharing a partition frame among other product units in a multi-row lead frame, and has a non-mirrorsymmetric pad region and at least one terminal region arranged inside and held to a rectangular outer frame region, which is a part of the partition frame and forms a boundary of the lead frame as a product unit, via respective suspension leads, wherein suspension leads that hold the non-mirrorsymmetric pad region to the outer frame region is composed of two suspension leads, which extend from opposite sides of the rectangular outer frame region to the non-mirrorsymmetric pad region, respectively.

In production of a lead frame formed by etching, the stress in the material may remain depending on the pattern, to cause deformation of the entire frame. Even if the number of suspension leads is sufficient to support the non-mirrorsymmetric pad region, biasing force originating from internal stress may fail to be dispersed depending on the layout pattern of the suspension leads inside the outer frame region, to cause deformation on block basis or on frame basis.

In this context, the repeated trial and error has led the present applicant to the conception that, in a multi-row lead frame in which a lead frame as a product unit shares a partition frame among other product units, an appropriate layout of suspension leads for holding a non-mirrorsymmetric pad region arranged inside an outer frame region, which is a part of the partition frame, should efficiently disperse biasing force originating from internal stress, to prevent the frame from warp or bend.

The present applicant has found that, even with a substantial number of suspension leads being arranged, asymmetric configuration regarding positions and suspension directions of the suspension leads involves a high risk of deformation of the outer frame region, to possibly affect conveyance, assembly, and quality in production processes.

In the lead frame according to the embodiment mode of the present invention, suspension leads for holding a non-mirrorsymmetric pad region to an outer frame region, which is a part of a partition frame in a multi-row lead frame and forms a boundary of the lead frame as a product unit, are constructed of two suspension leads extending from opposite sides of the outer frame region to the non-mirrorsymmetric pad region, so that direction and magnitude of forces applied to the outer frame region by the two suspension leads can be well balanced. As a result, stresses in the frame can be efficiently dispersed, to prevent warp or bend.

In the lead frame according to the embodiment mode of the present invention, the two suspension leads holding the non-mirrorsymmetric pad region to the outer frame region extend in parallel directions, so that the stresses applied to the opposite sides of the outer frame region are easily dispersed as well balanced.

In the lead frame according to the embodiment mode of the present invention, the two suspension leads holding the non-mirrorsymmetric pad region are joined to the non-mirrorsymmetric pad region at positions that are equidistant from a center of gravity of the non-mirrorsymmetric pad region, respectively, so that the stresses applied to the opposite sides of the outer frame region are kept in the best balance, to prevent warp or bend more effectively.

Hereafter, the embodiment mode of the present invention will be explained in reference to the drawings.

First Embodiment Mode

FIG. 1. is a diagram that schematically shows the configuration of the essential part of the lead frame according to the first embodiment mode of the present invention.

The lead frame of the first embodiment mode forms one product unit in a multi-row lead frame upon sharing a partition frame among other product units, and has a non-mirrorsymmetric pad region 1 and at least one terminal region 2 arranged inside and held to a rectangular outer frame region 5, which is a part of the partition frame and forms a boundary of the lead frame as a product unit, via respective suspension leads 3 and 4.

The non-mirrorsymmetric pad region 1 is configured so that the pad portion itself, on which a semiconductor element is to be mounted, is shaped to be non-mirrorsymmetric (for example, L-shape) or the pad portion itself and a terminal portion are integrally formed to have a non-mirrorsymmetric shape (for example, L-shape).

The rectangular outer frame region 5 is constructed of dambars and connection bars, as a part of the partition frame forming boundaries of individual lead frames as product units in the multi-row lead frame.

The suspension lead 3 which holds the non-mirrorsymmetric pad region 1 to the outer frame region 5 is constructed of two suspension leads 3a and 3b. The two suspension leads 3a and 3b extend from opposite sides 5a and 5b of the rectangular outer frame region 5 to the non-mirrorsymmetric pad region 1, respectively. The two suspension leads 3a and 3b extend in parallel directions. While the two suspension leads 3a and 3b are arranged on two different straight lines parallel to each other in the example of FIG. 1, the parallel lines may overlap, that is, the two suspension leads 3a and 3b may be arranged on one straight line. Also, it is preferred that the two suspension leads 3a and 3b are joined to the non-mirrorsymmetric pad region 1 at positions that are equidistant from the center of gravity of the non-mirrorsymmetric pad region 1, respectively.

The suspension leads 4 extend from one side 5c of the rectangular outer frame region 5 to the terminals 2, respectively.

According to the lead frame of the first embodiment mode thus configured, direction and magnitude of forces applied, via the two suspension leads 3a and 3b joined to the non-mirrorsymmetric pad region 1, to the outer frame region 5, which is a part of a partition frame shared among other lead frames in a multi-row lead frame and forms a boundary of the lead frame as a product unit, can be well balanced. As a result, stresses in the frame can be efficiently dispersed, to prevent warp or bend.

Also, since the two suspension leads 3a and 3b holding the non-mirrorsymmetric pad region 1 to the outer frame region 5 extend in parallel directions, the stresses applied to the opposite sides of the outer frame region 5 are easily dispersed as well balanced.

Further, if the two suspension leads 3a and 3b holding the non-mirrorsymmetric pad region are joined to the non-mirrorsymmetric pad region 1 at positions that are equidistant from a center of gravity of the non-mirrorsymmetric pad region 1, respectively, the stresses applied to the opposite sides of the outer frame region 5 are easily dispersed as well balanced.

EMBODIMENT AND REFERENCE EXAMPLES

Figure 2:
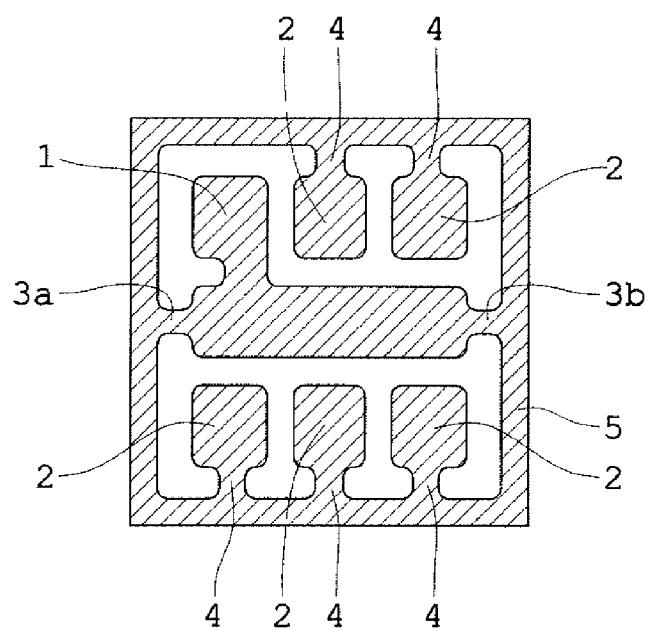
FIG. 2. is an explanatory diagram that shows the layout of suspension leads of the lead frame according to Embodiment 1 of the present invention.
Figure 3A:
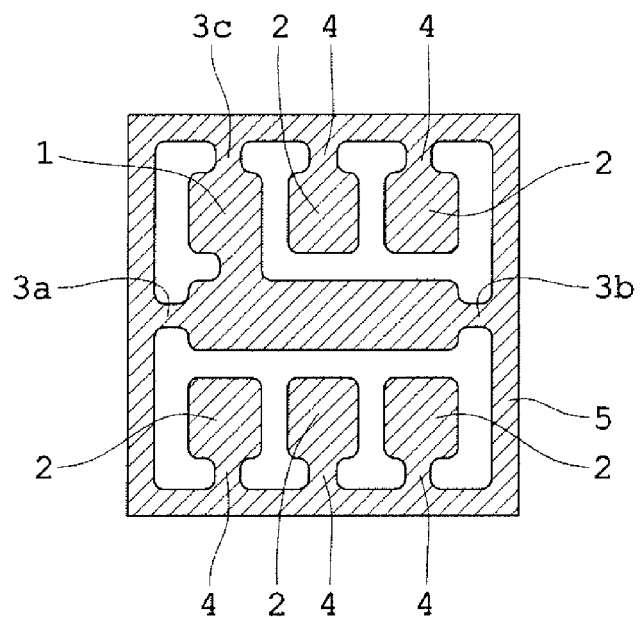
FIG. 3A is an explanatory diagram that shows the layout of suspension leads of the lead frame according to Reference Example 1.
Figure 3B:
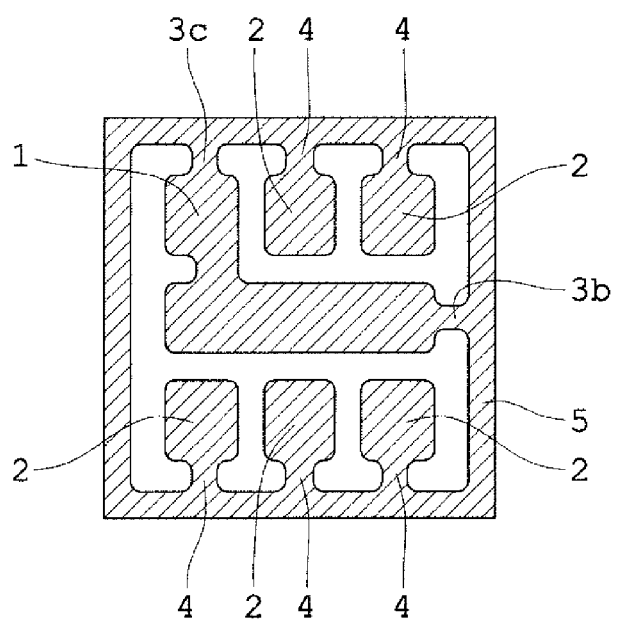
FIG. 3B is an explanatory diagram that shows the layout of suspension leads of the lead frames according to Reference Example 2.
Figure 4:
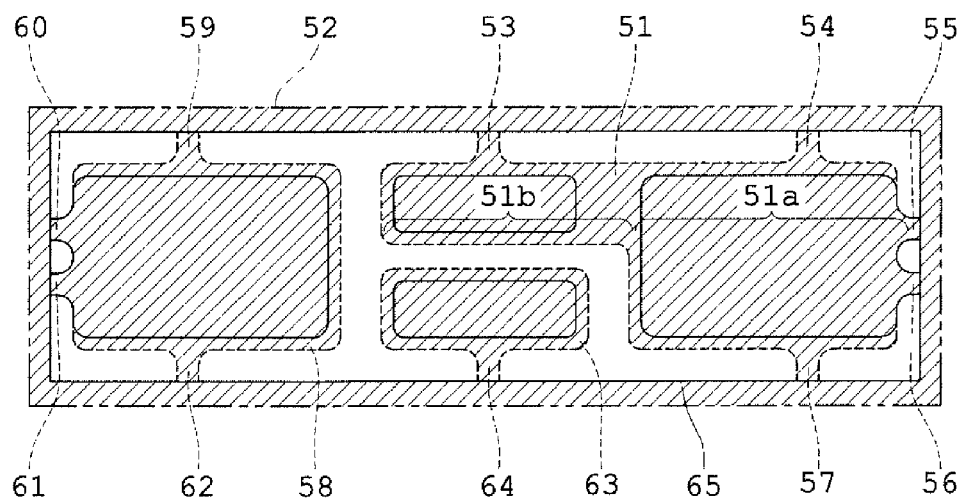
FIG. 4. is an explanatory diagram that shows one layout example of a conventional lead frame having a non-mirrorsymmetric pad region.

FIG. 2. is an explanatory diagram that shows the layout of suspension leads of the lead frame according to Embodiment 1 of the present invention. FIGS. 3A-3B are explanatory diagrams that show the layouts of suspension leads, of Reference Example 1 and of Reference Example 2, respectively.

As lead frames of Embodiment 1 of the present invention, there were produced by etching process multi-row lead frames each including a multiple number of lead frames as product units continuously arranged in row and column directions (for example, about 20 to 40 in each of row and column directions), wherein, as shown in FIG. 2, each of the lead frames, as a product unit, had a non-mirrorsymmetric pad region 1 arranged inside and held to a rectangular outer frame region 5, which was a part of a partition frame shared among the multiple number of lead frames as product units and formed a boundary of the lead frame as a product unit, via two suspension leads 3a and 3b extending along a single straight line (linearly) from opposite sides of the outer frame region 5.

Also, as lead frames of Reference Example 1, there were produced by etching process multi-row lead frames each including a multiple number of lead frames as product units continuously arranged in row and column directions (for example, about 20 to 40 in each of row and column directions), wherein, as shown in FIG. 3A, each of the lead frames, as a product unit, had a non-mirrorsymmetric pad region 1 arranged inside and held to a rectangular outer frame region 5, which was a part of a partition frame shared among the multiple number of lead frames as product units and formed a boundary of the lead frame as a product unit, via three suspension leads which included, in addition to the suspension leads 3a and 3b, a suspension lead 3c extending in a direction orthogonal to the extending direction of the suspension leads 3a and 3b.

Also, as lead frames of Reference Example 2, there were produced by etching process multi-row lead frames each including a multiple number of lead frames as product units continuously arranged in row and column directions (for example, about 20 to 40 in each of row and column directions), wherein, as shown in FIG. 3B, each of the lead frames, as a product unit, had a non-mirrorsymmetric pad region 1 arranged inside and held to a rectangular outer frame region 5, which was a part of a partition frame shared among the multiple number of lead frames as product units and formed a boundary of the lead frame as a product unit, via two suspension leads 3b and 3c extending from adjacent sides of the outer frame region 5 in mutually orthogonal directions.

Then, the multi-row lead frames of Embodiment 1, Reference example 1, and Reference Example 2 were compared to each other with respect to warp and bend conditions.

The check on warp and bend conditions of each multi-row lead frame was conducted by illuminating the object under the test with light from upper side and observing, from a view point deeply angled from the normal to the object, reflection of light from the object. A multi-row lead frame that showed a uniform reflection condition over its entirety was judged to have no warp or bend, while a multi-row lead frame that showed uneven reflection varying position by position was judged to have warp or bend.

First, with respect to connection bars as an outer frame region 5, which is a part of a partition frame shared among a multiple number of lead frames as product units and forms a boundary of a lead frame as a product unit, multi-row lead frames having connection bar width of 0.120 mm and 0.140 mm, respectively, were produced with a half etching depth of 0.120 mm. Regarding lead frames of Reference Example 1, in addition to those having the above-mentioned connection bar dimensions, a multi-row lead frame produced to have connection bar width of 0.160 mm with a half etching depth of 0.120 mm and a multi-row lead frame produced full-metal, without half etching, to have connection bar width of 0.100 mm were used.

As a result, regarding the lead frames of Reference Example 1, in which the non-mirrorsymmetric pad region 1 was held by three suspension leads 3a, 3b and 3c extending to be joined to three sides of the outer frame region 5, warp or bend was recognized in all of the objects except that produced full-metal to have connection bars of 0.100 mm width (i.e. in each of the objects having connection bar widths of 0.120 mm, 0.140 mm and 0.160 mm, respectively). In contrast, regarding the lead frames of Embodiment 1 and Reference Example 2, in which the non-mirrorsymmetric pad region 1 was held by two suspension leads to the outer frame region 5, warp or bend was not recognized in either of the objects having connection bar widths of 0.120 mm and 0.140 mm, respectively.

Next, with respect to connection bars as an outer frame region 5, which is a part of a partition frame shared among a multiple number of lead frames as product units and forms a boundary of a lead frame as a product unit, multi-row lead frames having connection bar widths of 0.100 mm and 0.120 mm, respectively, were produced with a half etching depth of 0.130 mm. Regarding lead frames of Reference Example 1, in addition to those having the above-mentioned connection bar dimensions, a multi-row lead frame produced to have connection bar width of 0.140 mm with a half etching depth of 0.130 mm and a multi-row lead frame produced to have connection bar width of 0.080 mm with a half etching depth of 0.010 mm were used.

As a result, regarding the lead frames of Reference Example 1, in which the non-mirror symmetric pad region 1 was held by three suspension leads 3a, 3b and 3c extending to be joined to three sides of the outer frame region 5, warp or bend was recognized in all of the objects except that produced to have connection bar width of 0.080 mm with a half etching depth of 0.010 mm (i.e. in each of the objects having connection bar widths of 0.100 mm, 0.120 mm and 0.140 mm, respectively). Regarding the lead frames of Reference Example 2, in which the non-mirrorsymmetric pad region 1 was held by two suspension leads 3b and 3c extending from two adjacent sides of the outer frame region 5, respectively, warp or bend was recognized in each of the objects having connection bar widths of 0.100 mm and 0.120 mm, respectively. In contrast, regarding the lead frames of Embodiment 1, in which the non-mirrorsymmetric pad region 1 was held by two suspension leads 3a and 3b extending to be joined to the opposite sides of the outer frame region 5, respectively, warp or bend was not recognized in either of the objects having connection bar widths of 0.100 mm and 0.120 mm, respectively.

Next, with respect to connection bars as an outer frame region 5, which is a part of a partition frame shared among a multiple number of lead frames as product units and forms a boundary of a lead frame as a product unit, multi-row lead frames having connection bar widths of 0.110 mm and 0.130 mm, respectively, were produced with a half etching depth of 0.120 mm. Regarding lead frames of Reference Example 1, in addition to those having the above-mentioned connection bar dimensions, a multi-row lead frame produced to have connection bar width of 0.150 mm with a half etching depth of 0.120 mm and a multi-row lead frame produced full-metal, without half etching, to have connection bar width of 0.090 mm were used.

As a result, regarding the lead frames of Reference Example 1, in which the non-mirrorsymmetric pad region 1 was held by three suspension leads 3a, 3b and 3c extending to be joined to three sides of the outer frame region 5, warp or bend was recognized in all of the objects except that produced full-metal to have connection bar width of 0.090 mm (i.e. in each of the objects having connection bar widths of 0.110 mm, 0.130 mm and 0.150 mm, respectively). Regarding the lead frames of Reference Example 2, in which the non-mirrorsymmetric pad region 1 was held by two suspension leads 3b and 3c extending from two adjacent sides of the outer frame region 5, respectively, while warp or bend was not recognized in the object having a connection bar width of 0.130 mm, warp or bend was recognized in the object having a connection bar width of 0.110 mm. In contrast, regarding the lead frames of Embodiment 1, in which the non-mirrorsymmetric pad region 1 was held by two suspension leads 3a and 3b extending to be joined to the opposite sides of the outer frame region 5, respectively, warp or bend was not recognized in either of the objects having connection bar widths of 0.110 mm and 0.130 mm, respectively.

Next, with respect to connection bars as an outer frame region 5, which is a part of a partition frame shared among a multiple number of lead frames as product units and forms a boundary of a lead frame as a product unit, multi-row lead frames having connection bar widths of 0.100 mm and 0.120 mm, respectively, were produced with a half etching depth of 0.120 mm. Regarding lead frames of Reference Example 1, in addition to those having the above-mentioned connection bar dimensions, a multi-row lead frame produced to have connection bar width of 0.140 mm with a half etching depth of 0.120 mm and a multi-row lead frame produced full-metal, without half etching, to have connection bar width of 0.080 mm were used.

As a result, regarding the lead frames of Reference Example 1, in which the non-mirrorsymmetric pad region 1 was held by three suspension leads 3a, 3b and 3c extending to be joined to three sides of the outer frame region 5, warp or bend was recognized in all of the objects except that produced full-metal to have connection bar width of 0.080 mm (i.e. in each of the objects having connection bar widths of 0.100 mm, 0.120 mm and 0.140 mm, respectively). Regarding the lead frames of Reference Example 2, in which the non-mirrorsymmetric pad region 1 was held by two suspension leads 3b and 3c extending from two adjacent sides of the outer frame region 5, respectively, while warp or bend was not recognized in the object having a connection bar width of 0.120 mm, warp or bend was recognized in the object having a connection bar width of 0.100 mm. In contrast, regarding the lead frames of Embodiment 1, in which the non-mirrorsymmetric pad region 1 was held by two suspension leads 3a and 3b extending to be joined to the opposite sides of the outer frame region 5, respectively, warp or bend was not recognized in either of the objects having connection bar widths of 0.100 mm and 0.120 mm, respectively.

Tables 1 to 3 below show the result of comparison regarding bend and warp conditions between lead frames provided with the suspension configurations according to Embodiment 1, Reference Example 1, and Reference Example 2. In Tables 1 to 3, "x" denotes that all of five product units of lead frames as samples were recognized to have warp or bend, "o" denotes that none of five product units of lead frames as samples were recognized to have warp or bend, and "uv" denotes that, although unverified in the tests, warp or bend is considered to be possible in view of the results "o" or "x" of other items.

TABLE 1

Embodiment 1

| (unit: mm) | | connection bar width | | | | | | |
|---|---|---|---|---|---|---|---|---|
| | | 0.15 | 0.14 | 0.13 | 0.12 | 0.11 | 0.10 | 0.08 |
| connection bar half etching depth (intended value) | 0.17 | x | x | | x | | x | x |
| | 0.16 | x | x | | x | | x | x |
| | 0.15 | uv | uv | | uv | | uv | uv |
| | 0.14 | uv | uv | | uv | | uv | uv |
| | 0.13 | o | o | | o | o | o | uv |
| | 0.12 | o | o | o | o | o | o | uv |
| | 0.11 | o | o | | o | | o | uv |
| | 0.10 | o | o | | o | | o | uv |

TABLE 2

Reference Example 1

| (unit: mm) | | connection bar width | | | | | | | | |
|---|---|---|---|---|---|---|---|---|---|---|
| | | 0.16 | 0.15 | 0.14 | 0.13 | 0.12 | 0.11 | 0.10 | 0.09 | 0.08 |
| connection bar half etching depth (intended value) | 0.17 | | x | x | | x | | x | | x |
| | 0.16 | | x | x | | x | | x | | x |
| | 0.15 | | x | x | | x | | x | | x |
| | 0.14 | | x | x | | x | | x | | x |
| | 0.13 | | x | x | | x | | x | | x |
| | 0.12 | x | x | x | x | x | x | x | | x |
| | 0.11 | | o | uv | | x | | x | | x |
| | 0.10 | | o | uv | | x | | x | | x |
| | 0.01 | | | | | | | | | o |
| | 0.00 | | | | | | | o | o | o |

TABLE 3

Reference Example 2

| (unit: mm) | | connection bar width | | | | | | |
|---|---|---|---|---|---|---|---|---|
| | | 0.15 | 0.14 | 0.13 | 0.12 | 0.11 | 0.10 | 0.08 |
| connection bar half etching depth (intended value) | 0.17 | x | x | | x | | x | x |
| | 0.16 | x | x | | x | | x | x |
| | 0.15 | x | x | | x | | x | x |
| | 0.14 | uv | uv | | x | | x | x |
| | 0.13 | uv | uv | | x | | x | x |
| | 0.12 | o | o | o | o | x | x | x |
| | 0.11 | o | o | | o | | uv | x |
| | 0.10 | o | o | | o | | uv | x |

Out of the test results reported above, the test results for the lead frames of Embodiment 1, Reference Example 1 and Reference Example 2 each produced to have various connection bar widths with the same half etching depth of 0.120 mm are extracted and re-tabled in Table 4 below.

TABLE 4

Comparison regarding the relation between deformation and connection bar width

| | | connection bar half etching depth: 0.120 | | |
|---|---|---|---|---|
| (unit: mm) | | Embodiment 1 (dual suspension, linear) | Reference Example 2 (dual suspension, orthogonal) | Reference Example 1 (triple suspension) |
| connection bar width | 0.15 | o | o | x |
| | 0.14 | o | o | x |
| | 0.13 | o | o | x |
| | 0.12 | o | o | x |
| | 0.11 | o | x | x |
| | 0.10 | o | x | x |

The above result has verified that, lead frames of the dual suspension type of Embodiment 1 are less liable to cause warp or bend on block basis in a multi-row lead frame, in which the lead frames as product units share a partition frame, than lead frames of the dual suspension type of Reference Example 2, in which directions of suspension are not opposite, or lead frames of the triple suspension type of Reference Example 1.

Although lead frames having suspension leads of triple suspension type like Reference Example 1 had been predicted to be superior in strength, they often caused deformation inside the frames in practice, because stresses in the frames were not dispersed.

Also, regarding the lead frames having suspension leads of the double suspension type of Reference Example 2, as the connection bar width came to be thinner, warp or bend was caused more frequently on block basis in a multi-row lead frame in which the lead frames as product units share a partition frame.

In contrast, regarding the lead frames having suspension leads of the double suspension type of Embodiment 1, even if they had a connection bar width as thin as that at which lead frames of Reference Example 2 caused warp or bend on block basis in a multi-row lead frame in which the lead frames as product units share a partition frame, no warp or bend was caused on block basis in a multi-row lead frame in which the lead frames as product units share a partition frame.

In this way, it has been proved that warp or bend of the frame is avoidable with the stress in the frame being dispersed uniformly and efficiently in the lead frame of the present invention configured to hold a non-mirrorsymmetric pad region by two suspension leads that extend from opposite sides of an outer frame region, which is a part of a partition frame shared among lead frames as product units in a multi-row lead frame, to the non-mirrorsymmetric pad region, respectively.

In addition, as another example of Embodiment 1, there were produced and tested, for warp and bend conditions of a multi-row lead frame, lead frames as product units sharing a partition frame in the multi-row lead frame, wherein each lead frame as a product unit is configured to hold a non-mirrorsymmetric pad region by two suspension leads that are arranged in two different straight lines parallel to each other as extending from opposite sides of an outer frame region, which is a part of the partition frame shared among the lead frames as product units. The result of this test has revealed that the lead frame of this variation type of Embodiment 1 is at the same level as the lead frame configured to hold the non-mirrorsymmetric pad region 1 by the two suspension leads 3a and 3b extending along a single straight line (linearly) from opposite sides of the outer frame region 5, regarding warp or bend conditions on block basis in a multi-row lead frame. In other words, the lead frame of this variation type of Embodiment 1 also has been proved to be little liable to cause warp or bend on block basis in a multi-row lead frame in which a partition frame is shared among lead frames as product units.

The lead frame according to the present invention forms a product unit in a multi-row lead frame upon sharing a partition frame among other lead frames as product units, and is useful in the fields where there is required a lead frame having a non-mirrorsymmetric pad region inside an outer frame region, which is a part of the partition frame shared among the lead frames as product units.

What is claimed is:

1. A lead frame that forms one product unit in a multi-row lead frame upon sharing a partition frame among other lead frames as product units, the lead frame comprising:
    a non-mirrorsymmetric pad region; and
    at least one terminal region,
    wherein the non-mirrorsymmetric pad region and the at least one terminal region are arranged inside and held to a rectangular outer frame region, which is a part of the partition frame and forms a boundary of the lead frame as a product unit, via respective suspension leads, and
    wherein suspension leads that hold the non-mirrorsymmetric pad region to the rectangular outer frame region consist of two suspension leads, which extend from opposite sides of the rectangular outer frame region to the non-mirrorsymmetric pad region, respectively.

2. The lead frame according to claim 1,
    wherein the two suspension leads that hold the non-mirrorsymmetric pad region extend in parallel directions.

3. The lead frame according to claim 2,
    wherein the two suspension leads that hold the non-mirrorsymmetric pad region are joined to the non-mirrorsymmetric pad region at positions that are equidistant from a gravity center of the non-mirrorsymmetric pad region, respectively.

4. The lead frame according to claim 1,
    wherein the two suspension leads that hold the non-mirrorsymmetric pad region are joined to the non-mirrorsymmetric pad region at positions that are equidistant from a center of gravity of the non-mirrorsymmetric pad region, respectively.

5. The lead frame according to claim 1,
    wherein the non-mirrorsymmetric pad region is non-mirrorsymmetric with respect to any axis on a plane in which the rectangular outer frame region lies.

* * * * *